United States Patent [19]

Teaford et al.

[11] Patent Number: 4,833,049
[45] Date of Patent: May 23, 1989

[54] TERMINAL ASSEMBLY HAVING TWO SEALING LAYERS

[75] Inventors: Richard L. Teaford, Cincinnati; Glenn A. Honkomp, Loveland; Donald H. Hall, Cincinnati, all of Ohio

[73] Assignee: Emerson Electric Co., St. Louis, Mo.

[21] Appl. No.: 183,547

[22] Filed: Apr. 18, 1988

Related U.S. Application Data

[63] Continuation of Ser. No. 910,069, Sep. 22, 1986, abandoned, which is a continuation-in-part of Ser. No. 909,300, Sep. 9, 1986, Pat. No. 4,702,976.

[51] Int. Cl.$^4$ .............................................. H01M 2/30
[52] U.S. Cl. ................................. 429/181; 429/174; 429/175; 174/152 GM; 174/185
[58] Field of Search ............... 429/174, 175, 178, 180, 429/181, 185; 174/152 GM, 185; 501/15

[56] References Cited

U.S. PATENT DOCUMENTS

| | | | |
|---|---|---|---|
| 3,416,964 | 12/1968 | Michalko | 429/181 |
| 3,876,437 | 4/1975 | Otsuka et al. | 106/52 |
| 4,202,700 | 5/1980 | Wilder | 501/73 |
| 4,233,372 | 11/1980 | Bro et al. | 429/181 |
| 4,279,975 | 7/1981 | Bowsky | 429/181 |
| 4,308,323 | 12/1981 | Bowsky | 429/181 |
| 4,315,974 | 2/1982 | Athearn et al. | 429/181 |
| 4,362,792 | 12/1982 | Bowsky et al. | 429/181 |
| 4,514,590 | 4/1985 | Kyle | 174/152 GM |
| 4,556,613 | 12/1985 | Taylor et al. | 429/181 |

FOREIGN PATENT DOCUMENTS

| | | |
|---|---|---|
| 0067278 | 3/1982 | European Pat. Off. . |
| 2334640 | 12/1976 | France . |
| 59-207577A | 11/1984 | Japan . |
| 60-86755A | 5/1985 | Japan . |
| 1264697 | 9/1969 | United Kingdom . |
| 2014354A | 8/1979 | United Kingdom . |

OTHER PUBLICATIONS

Parmelee, C. W., "Ceramic Glazes", 2nd edition, Industrial Publication Inc., Chicago, Ill., 1951, pp. 270-271.
Article 2301 NT15, Glass for Sealing Lithium Cells.

*Primary Examiner*—John F. Niebling
*Assistant Examiner*—Steven P. Marquis
*Attorney, Agent, or Firm*—Polster, Polster and Lucchesi

[57] ABSTRACT

A terminal pin seal for an hermetic terminal assembly including at least two laminations one of which has the inner surface adjacent the assembly structure with electrochemical properties resistant to attack from chemical ingredients within the assembly and another of which laminations has the outer surface adjacent to ambient with electrochemical properties different from that lamination facing the assembly housing to produce a greater resistance to chemical attack from ambient.

10 Claims, 1 Drawing Sheet

TERMINAL ASSEMBLY HAVING TWO SEALING LAYERS

This is a continuation of co-pending application Ser. No. 910,069, filed Sept. 22, 1986, now abandoned, which is a continuation-in-part of co-pending application Ser. No. 909,300, filed Sept. 9, 1986, now U.S. Pat. No. 4,702,976, issued Oct. 27, 1987.

BACKGROUND OF THE INVENTION

The present invention relates to hermetic terminal assemblies and more particularly to an improved seal structure between an electrically conductive terminal pin and the wall of the assembly through which the terminal pin extends from within the assembly to ambient.

It is generally well known in the electrical terminal assembly art to utilize layers of differing materials to seal a terminal pin to a housing. For example, U.S. Pat. No. 4,308,323, issued to Benjamin Bowsky teaches first and second glass materials surrounding and extending coaxially relative each other and a terminal pin in which extends from within a battery through the battery wall, the first material being bonded to the pin and the second material being bonded to the first material and the wall, the object of the differing coextensive first and second materials being to provide an overall seal which exhibits a greater resistance to attack by chemicals than by an individual or sole material. More recently issued U.S. Pat. No. 4,514,590, issued to James C. Kyle on Apr. 30, 1985 employs terminal pin sealing layers of different materials, each of which generally extends in planar, sandwich form with the others normal to the longitudinal axis of the pin between the pin and the housing, the layers of different materials having different coefficients of thermal expansion to compensate for stresses in the terminal assembly as a result of temperature changes.

The present invention, unlike the prior art, recognizes that different electrochemical conditions exist within and outside a hermetically sealed assembly, then solves this recognized problem in sealing terminal pins in hermetically sealed assemblies in a unique and novel manner, requiring a minimum of materials and processing steps in both straight-forward and efficient manufacture and assembly steps and, at the same time, assuring a long lasting terminal pin seal both internally and externally of the hermetic assembly. The structure of the present invention accomplishes this without sacrifice of chemical integrity and stability of the seal, providing a terminal pin seal structure resistant to recognized differing conditions of humidity and corrosion without undesirable bubbles and pockets therein and with controlled seal stress conditions, utilizing these controlled stress conditions for a more efficient and effective seal through regulated material viscosity and compression characteristics. The structure of the present invention lends itself readily for use with hermetic terminal assemblies such as lithium batteries particularly, when constructed in accordance with the end closure structural arrangement as set forth in the aforementioned parent application, of which this application is a continuation-in-part.

Various other features of the present invention will become obvious to one skilled in the art upon reading the disclosure set forth herein. Although not to be considered in any manner as limited thereto, the unique structural features of the present invention have particular utility in the battery art—especially in batteries of the lithium type.

SUMMARY OF THE INVENTION

More particularly the present invention provides in an hermetic terminal assembly having a terminal pin extending from within the assembly through an apertured assembly wall to ambient, an improved aperture seal structure between the pin and assembly wall comprising: a first sealing lamination having inner and outer surfaces extending between the terminal pin and the assembly wall with the inner surface adjacent the assembly structure, the first sealing lamination having electrochemical properties to produce a preselected resistance to attack from chemical ingredients within the assembly; and, a second sealing lamination having inner and outer surfaces extending between the terminal pin and the assembly wall with the outer surface adjacent ambient, the second sealing lamination having electrochemical properties different from those of the first sealing lamination to produce a preselected resistance to chemical attack from ambient conditions. In addition, the present invention provides a third lamination which can be interposed between the first and second lamination to form an inhibiting shield to restrict flow of undesirable deteriorating properties between the first and second laminations.

It is to be understood that varius changes can be made by one skilled in the art in the several parts of the inventive structure disclosed herein without departing from the scope or spirit of the present invention. For example, the chemistry of the several laminations as well as the geometry could be changed in accordance with existing conditions both internally and externally of the hermetic assembly.

BRIEF DESCRIPTION OF THE DRAWING

Referring to the drawing which discloses an advantageous embodiment of the present invention and a modified embodiment thereof.

DETAILED DESCRIPTION OF THE DRAWING

Figure 1:
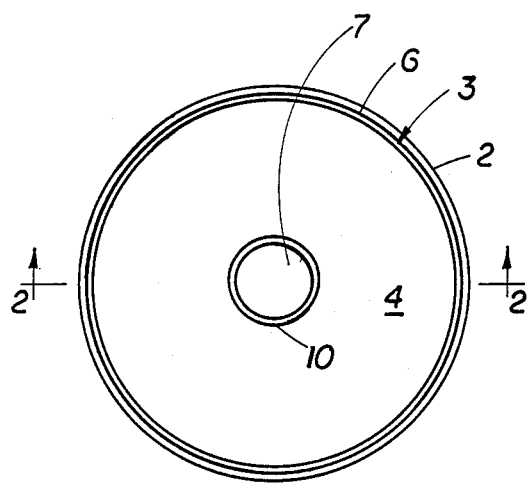
FIG. 1 is a plan view of a unique and novel end closure having an aperture therein and an extended peripheral wall portion integral therewith to surround the aperture, the end closure being disposed in a housing for an hermetic terminal assembly.
Figure 2:
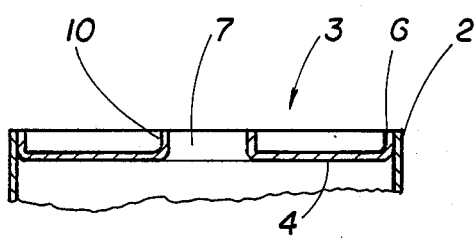
FIG. 2 is a cross-sectional view taken in a plane through line 2—2 of FIG. 1 showing the upper portion of the housing and end closure.

Referring to FIGS. 1 and 2 of the drawing, an hermetic terminal assembly housing 2 is shown having mounted therein end closure 3 including a circular main body portion 4 having a rim 6 extending normally from the periphery thereof. Rim 6 of end closure 3 can be sealed to the inner wall of housing 2 by a suitable welding means such as a laser beam (not shown). Main body portion 4 of end closure 3 includes a centrally disposed circular aperture 7 through which electrically conductive terminal pin 8 extends from housing 2 to ambient.

Figure 3:
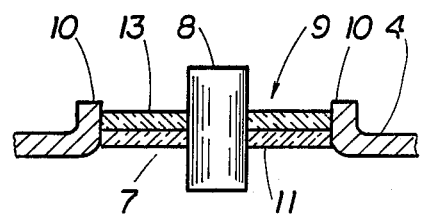
FIG. 3 is an enlarged cross-sectional view of a portion of the end closure of FIGS. 1 and 2, disclosing the inventive seal structure for a terminal pin extending over the aperture of the end closure; and, FIG. 4 is an enlarged cross-sectional view similar to that of FIG. 3, disclosing another form of the inventive seal structure employed with a conventional apertured end closure.

The structural components comprising housing 2 and end closure 3, which can be employed in any one of a number of types of hermetic terminal assemblies, such as those used for lithium type batteries, can be formed from a suitable stainless steel material, as can electrically conductive terminal pin 8, the chemistry of the materials used for these components being interdependent with the chemistry of the seal to be employed. In the embodiment of FIGS. 1–3, the end closure 3 is disclosed as being similar to that of the parent application of which this application is a continuation-in-part to include a main body portion 4 which can be thin and an integral peripheral wall portion 10 surrounding aperture 7 to extend at a preselected angle therefrom for a preselected distance. In the structural embodiment of FIG. 2, peripheral wall 10 extends substantially normal to main body portion 4 for a distance substantially equal to rim 6. It is to be understood that other geometric configurations for the several parts disclosed herein can be employed and that the end closure can have other conformations and can have more than one terminal pin extending therethrough, depending upon the nature of use of the hermetic terminal assembly.

Referring to FIG. 3 of the drawing, the inventive seal 9 is disclosed as extending in aperture 7 between the outer peripheral wall of terminal pin 8 and the aperture defining wall portion 10 extending from main body portion 4 of end closure 3, but in this regard, it is to be understood that a suitable apertured steel eyelet can be employed to be sealed in the aperture 7 of the main body portion 4 if so desired. In accordance with one advantageous embodiment of the present invention (FIG. 3), seal 9 is composed of two sealing laminations 11 and 13, each having inner and outer surfaces, each extending between the terminal pin 8 and the end closure main body portion 6 in a plane normal to the longitudinal axis of terminal pin 8. Sealing laminations 11 and 13 are selected from suitable sealing materials, such as glass, to have different electrochemical properties, the composition of the materials depending upon the chemical compositions of the material used for terminal pin 8 and main body portion 4 of end closure 3 and also with the chemical conditions of the terminal assembly and the ambient surrounding.

It is desirable that lamination 11, which has its inner surface adjacent the assembly structure in housing 2, be formed from material having electrochemical properties capable of producing a preselected resistance to attack from chemical ingredients within the assembly. Equally it is desirable that lamination 13 be formed from material different from the material of lamination 11, so that the outer surface of lamination 13 adjacent ambient has electrochemical properties capable of producing a preselected resistance to attack, such as corrosion, from ambient chemistry. It is further desirable that in selecting the chemistry of seal laminations 11 and 13 that the flow viscosity and coefficient of expansion characteristics of each during fusing conditions be similar and that their coefficients of expansion be compatible with the coefficients of expansion of the materials forming the terminal pins and main body portion of the end closure so that the resulting overall seal formed by the laminations be in compression after the melt forming step involved in sealing the terminal pin to the assembly. It is to be noted that to improve bonding prior to assembly, the surfaces of the preselected glass beads used to form laminations 11 and 13 can be appropriately treated with oxides or etched, as can the material to which they are sealed.

It has been found that in a lithium battery assembly, glass materials of different electrochemical properties can be successfully employed with the $SiO_2$ content by weight for lamination 11, which has its inner surface adjacent the assembly, being substantially less than the $SiO_2$ content in lamination 13, which lamination 13 has its outer surface adjacent ambient. This different serves to increase the chemical resistance of the exposed surface of each lamination to the particular environment to which it is exposed, lamination 11 to the assembly and lamination 13 to ambient.

Advantageously and more specifically, in a lithium battery assembly, lamination 11 closest to the hermetic terminal assembly electrolyte can be comprised approximately by weight chemically of 10 to 45% $SiO_2$, 10 to 25% $B_2O_3$, 3 to 10% $Al_2O_3$, 2 to 10% $La_2O_3$, 10 to 30% light metal oxides of the second group in the periodic chemical table comprising MgO, CaO, SrO and BaO and 5 to 25% light metal oxides of the first group in the periodic chemical table comprising $LiO_2$, $Na_2O$ and $K_2O$. Lamination 13 can be comprised approximately by weight of 50 to 65% $SiO_2$, 4 to 12% $B_2O_3$, 1 to 5% $Al_2O_3$, 5 to 15% light metal oxides of the second group in the periodic chemical table comprising CaO, SrO and BaO and 5 to 20% light metal oxides of the first group in the periodic chemical table comprising $LiO_2$, $Na_2O$ and $K_2O$. It is to be noted that both the flow viscosity and coefficient of expansion characteristics of each of these laminations 11 and 13, having the aforedescribed chemical compositions, are substantially similar with similar flow viscosities having glass setting points of 440° C. and 450° C. respectively being within approximately 10° C. of each other and with similar coefficients of expansion of $11.3 \times 10^{-6}$ in/in °C. and $11.4 \times 10^{-6}$ in/in °C. respectively being within approximately 1% of each other and that these coefficients of expansion are so selected to be compatible with the coefficients of expansion of adjacent metallic materials, such as 446 stainless steel material used for terminal pins and 304L stainless steel used for eyelets and end covers. Thus the bonding of the laminations 11 and 13 is enhanced at fusion and the overall seal 9 is compressed between the terminal pin 8 and main body portion 4 of end closure 3.

Figure 4:
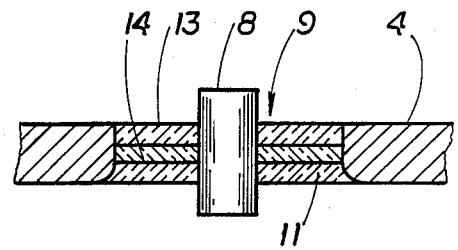

Referring to FIG. 4, a further embodiment of the present invention can be seen, wherein there is sandwiched between laminations 11 and 13 of seal 9, an intermediate lamination 4 which lamination can be of a suitable ceramic material serving to inhibit corrosion migration between the two laminations 11 and 13. It is to be understood that the chemistry of this intermediate ceramic lamination 14 is so selected that the coefficient of expansion characteristics are similar to the coefficient of expansion characteristics of laminations 11 and 13 and that this ceramic lamination 14 has porosity characteristics which enhance the bonding of the surrounding laminations 11 and 13 thereto during the heat fusion step in assembly.

As aforenoted, various changes can be made by one skilled in the art in the interdependent chemistry and in the physical geometry of the several parts disclosed herein without departing from the scope or spirit of this invention in order to produce the greater resistance to attack on either or both sides of seal 9.

The invention claimed is:

1. In an hermetic terminal assembly having a terminal pin extending from within the assembly through an apertured assembly wall to ambient, said assembly housing having a corrosive environment, an improved aperture seal structure between said pin and assembly wall comprising:
  a first substantially flat aperture sealing lamination having spaced inner and outer planar surfaces extending continuously between the outer peripheral surface of said terminal pin and the periphery of said assembly wall aperture with said inner surface of said first lamination being adjacent and exposed to said corrosive environment of said assembly structure, said first sealing lamination having corrosive resistant properties to produce a preselected resistance to attack from ingredients producing said corrosive environment within the assembly; and,
  a second flat aperture sealing lamination having spaced inner and outer planar surface extending continuously between the outer peripheral surface of said terminal pin and the periphery of said assembly wall aperture with said outer surface adjacent ambient, said second aperture sealing lamination having corrosion resistant properties different from those of said first aperture sealing lamination to produce a preselected resistance to attack from ambient conditions; said first and said second sealing laminations being of different corrosive resistant properties but with similar viscosities having setting points within approximately 10° C. of each other and coefficients of expansion within approximately 1% of each other which coefficients of expansion are compatible with that of the material to which the sealing laminations are sealingly bonded.

2. The seal structure of claim 1, said first and second sealing lamination having adjoining surfaces.

3. The seal structure of claim 1, said assembly wall through which said terminal pin extends comprising an end closure having an aperture therein and an extended peripheral wall portion integral therewith to surround said aperture and extend at a preselected angle to said main body portion for a preselected distance, said first and second sealing laminations extending between said terminal pin and said extended peripheral wall portion.

4. The seal structure of claim 1, said terminal assembly including an end closure and an apertured eyelet through which said terminal pin passes and is sealed.

5. The seal structure of claim 1, said first and said second sealing laminations being glass of different corrosion resistant properties.

6. The structure of claim 1, said terminal assembly comprising a lithium battery assembly, said first and said second sealing laminations being glass of different corrosion resistant properties with the $SiO_2$ content in said first lamination being substantially less by weight than the $SiO_2$ content in said second lamination to increase the corrosion resistance to lithium battery electrolytes.

7. The structure of claim 1 and an intermediate lamination between said first and second sealing laminations having properties to inhibit corrosion migration between said first and second sealing laminations.

8. The structure of claim 1, said terminal assembly comprising a lithium battery assembly, said first lamination being comprised approximately by weight of 10 to 45% $SiO_2$, 10 to 25% $B_2O_3$, 3 to 10% $Al_2O_3$, 2 to 10% $La_2O_3$, 10 to 30% light metal oxides of the second group in the periodic chemical table and 5 to 25% light metal oxides of the first group in the periodic chemical table; and,
  said second lamination being comprised approximately by weight of 50 to 65% $SiO_2$, 4 to 12% $B_2O_3$, 1 to 5% $Al_2O_3$, 5 to 15% light metal oxides of the second group in the periodic chemical table and 5 to 25% light metal oxides of the first group of the periodic chemical table.

9. The structure of claim 8, said first lamination light metal oxides of the second group comprising MgO, CaO, SrO and BaO and of the first group comprising $LiO_2$, $Na_2O$ and $K_2O$; and,
  said second lamination light metal oxides of the second group comprising CaO, SrO, and BaO and of the first group comprising $LiO_2$, $Na_2O$ and $K_2O$.

10. An improved lithium battery assembly comprising:
  a battery housing having lithium electrolytes disposed therein;
  an end closure cover for said battery housing, said end closure having an aperture disposed therein;
  an annular metallic eyelet fuse welded in said end closure aperture;
  a metallic terminal pin extending through said eyelet; and,
  a seal structure extending continuously between the outer peripheral surface of said pin and the inner wall of said annular metallic eyelet including a first flat glass sealing lamination having spaced inner and outer planar surfaces extending continuously between the outer peripheral surface of said pin and said wall of said annular eyelet with said inner surface adjacent said lithium electrolytes in said battery house, said first glass lamination being comprised approximately by weight of 10 to 45% $SiO_2$, 10 to 25% $B_2O_3$, 3 to 20% $Al_2O_3$, 2 to 10% $LaO_3$, 10 to 30% light metal oxides including MgO, CaO, SrO and BaO and 5 to 25% light metal oxides including $LiO_2$, $Na_2O$ and $K_2O$; and,
  a second flat glass sealing lamination having spaced inner and outer planar surfaces extending continuously between the outer peripheral surface of said pin and said inner wall of said annular eyelet with said inner surface abutting said outer surface of said first lamination and said outer surface exposed to ambient, said second glass lamination being comprised approximately by weight of 50 to 65% $SiO_2$, 4 to 12% $B_2O_3$, 1 to 5% $Al_2O_3$, 5 to 15% light metal oxides including CaO, SrO and BaO and 5 to 25% light metal oxides of $LiO_2$, $Na_2O$ and $K_2O$;
  said first and said second glass sealing laminations abuttingly facing each other to be coextensive along the entirety of the abutting faces and having similar viscosities having setting points within approximately 10° C. of each other and coefficients of expansion within approximately 1% of each other, which coefficients of expansion are compatible with that of the metallic material to which the glass laminations are sealingly bonded.

* * * * *

UNITED STATES PATENT AND TRADEMARK OFFICE
CERTIFICATE OF CORRECTION

PATENT NO. : 4,833,049

DATED : May 23, 1989

INVENTOR(S) : Richard L. Teaford, Glen Honkomp and Donald H. Hall

It is certified that error appears in the above-identified patent and that said Letters Patent is hereby corrected as shown below:

Column 2, line 28, "varius" should be --various--.
Column 4, line 49, "4" should be --14--.

Signed and Sealed this

Eighteenth Day of September, 1990

Attest:

HARRY F. MANBECK, JR.

*Attesting Officer*   *Commissioner of Patents and Trademarks*